United States Patent
Hafed et al.

(10) Patent No.: US 8,327,204 B2
(45) Date of Patent: *Dec. 4, 2012

(54) HIGH-SPEED TRANSCEIVER TESTER INCORPORATING JITTER INJECTION

(75) Inventors: Mohamed M. Hafed, Montreal (CA); Sebastien Laberge, Montreal (CA); Bardia Pishdad, Montreal (CA); Clarence K. L. Tam, Montreal (CA)

(73) Assignee: DFT Microsystems, Inc., Burlington, MA (US)

( * ) Notice: Subject to any disclaimer, the term of this patent is extended or adjusted under 35 U.S.C. 154(b) by 1694 days.

This patent is subject to a terminal disclaimer.

(21) Appl. No.: 11/553,035

(22) Filed: Oct. 26, 2006

(65) Prior Publication Data

US 2007/0113119 A1    May 17, 2007

Related U.S. Application Data

(60) Provisional application No. 60/730,633, filed on Oct. 27, 2005.

(51) Int. Cl.
  *G01R 31/3183* (2006.01)
  *G01R 31/40* (2006.01)
(52) U.S. Cl. ...................... 714/731; 714/700
(58) Field of Classification Search .......... None
  See application file for complete search history.

(56) References Cited

U.S. PATENT DOCUMENTS

| | | |
|---|---|---|
| 3,931,610 A | 1/1976 | Marin et al. |
| 3,976,940 A | 8/1976 | Chau et al. |
| 4,677,648 A | 6/1987 | Zurfluh |
| 4,807,147 A | 2/1989 | Halbert et al. |
| 5,329,258 A | 7/1994 | Matsuura |
| 5,349,587 A | 9/1994 | Nadeau-Dostie et al. |
| 5,517,147 A | 5/1996 | Burroughs et al. |
| 5,563,921 A | 10/1996 | Mesuda et al. |
| 5,606,567 A | 2/1997 | Agrawal et al. |
| 5,835,501 A | 11/1998 | Dalmia et al. |
| 5,883,523 A | 3/1999 | Ferland et al. |
| 5,948,115 A | 9/1999 | Dinteman |
| 6,008,703 A | 12/1999 | Perrott et al. |

(Continued)

FOREIGN PATENT DOCUMENTS

EP    1571455 A2    9/2005

(Continued)

OTHER PUBLICATIONS

Notice of Allowance dated Oct. 28, 2009, with regard to related U.S. Appl. No. 11/776,825, filed Jul. 12, 2007, Mohamed M. Hafed.

(Continued)

*Primary Examiner* — John Trimmings
*Assistant Examiner* — Dipakkumar Gandhi
(74) *Attorney, Agent, or Firm* — Downs Rachlin Martin PLLC

(57) ABSTRACT

A tester for testing high-speed serial transceiver circuitry. The tester includes a jitter generator that uses a rapidly varying phase-selecting signal to select between two or more differently phased clock signals to generate a phase-modulated signal. The phase-selecting signal is designed to contain low- and high-frequency components. The phase-modulated signal is input into a phase filter to filter unwanted high-frequency components. The filtered output of the phase filter is input into a data-transmit serializer to serialize a low-speed parallel word into a high-speed jittered test pattern for input into the transceiver circuitry.

26 Claims, 3 Drawing Sheets

U.S. PATENT DOCUMENTS

| | | | |
|---|---|---|---|
| 6,057,679 | A | 5/2000 | Slizynski et al. |
| 6,076,175 | A | 6/2000 | Drost et al. |
| 6,091,671 | A | 7/2000 | Kattan |
| 6,181,267 | B1 | 1/2001 | MacDonald et al. |
| 6,225,840 | B1 | 5/2001 | Ishimi |
| 6,275,057 | B1 | 8/2001 | Takizawa |
| 6,329,850 | B1 | 12/2001 | Mair et al. |
| 6,356,850 | B1 | 3/2002 | Wilstrup et al. |
| 6,374,388 | B1 | 4/2002 | Hinch |
| 6,420,921 | B1 | 7/2002 | Okayasu et al. |
| 6,570,454 | B2 | 5/2003 | Skierszkan |
| 6,629,274 | B1 | 9/2003 | Tripp et al. |
| 6,640,193 | B2 | 10/2003 | Kuyel |
| 6,650,101 | B2 | 11/2003 | MacDonald et al. |
| 6,658,363 | B2 | 12/2003 | Mejia et al. |
| 6,665,808 | B1 | 12/2003 | Schinzel |
| 6,710,726 | B2 * | 3/2004 | Kim et al. ............ 341/100 |
| 6,768,360 | B2 | 7/2004 | Tsuruki |
| 6,768,390 | B1 | 7/2004 | Dunsmore et al. |
| 6,775,809 | B1 | 8/2004 | Lambrecht et al. |
| 6,785,622 | B2 | 8/2004 | Nygaard, Jr. |
| 6,791,389 | B2 | 9/2004 | Mikami et al. |
| 6,816,987 | B1 | 11/2004 | Olson et al. |
| 6,816,988 | B2 | 11/2004 | Barford |
| 6,834,367 | B2 | 12/2004 | Bonneau et al. |
| 6,842,061 | B2 | 1/2005 | Suda et al. |
| 6,859,106 | B2 | 2/2005 | Sano |
| 6,865,222 | B1 | 3/2005 | Payne |
| 6,865,496 | B2 | 3/2005 | Camnitz et al. |
| 6,868,047 | B2 | 3/2005 | Sartschev et al. |
| 6,888,412 | B2 | 5/2005 | Kim et al. |
| 6,907,553 | B2 | 6/2005 | Popplewell et al. |
| 6,909,316 | B2 | 6/2005 | Owens et al. |
| 6,909,980 | B2 | 6/2005 | Fernando |
| 6,918,073 | B2 | 7/2005 | Linam et al. |
| 6,931,579 | B2 | 8/2005 | Roberts et al. |
| 6,934,896 | B2 | 8/2005 | Larson et al. |
| 6,940,330 | B2 | 9/2005 | Okayasu |
| 6,944,835 | B2 | 9/2005 | Okayasu |
| 6,961,745 | B2 | 11/2005 | Laquai |
| 6,993,109 | B2 | 1/2006 | Lee et al. |
| 7,136,772 | B2 | 11/2006 | Duchi et al. |
| 7,287,200 | B2 | 10/2007 | Miyaji |
| 7,355,378 | B2 | 4/2008 | Rottacker et al. |
| 7,627,003 | B1 * | 12/2009 | Fouts et al. ............ 370/503 |
| 7,681,091 | B2 * | 3/2010 | Hafed ............ 714/700 |
| 7,813,297 | B2 | 10/2010 | Hafed |
| 2001/0028251 | A1 | 10/2001 | Okayasu |
| 2002/0019962 | A1 | 2/2002 | Roberts et al. |
| 2002/0033878 | A1 | 3/2002 | Satoh et al. |
| 2002/0147951 | A1 | 10/2002 | Nadeau-Dostie et al. |
| 2003/0031283 | A1 * | 2/2003 | Bronfer et al. ............ 375/371 |
| 2003/0122600 | A1 | 7/2003 | Engl et al. |
| 2003/0128720 | A1 | 7/2003 | Jones |
| 2003/0165051 | A1 | 9/2003 | Kledzik et al. |
| 2003/0189504 | A1 * | 10/2003 | Colonna et al. ............ 341/143 |
| 2003/0198311 | A1 | 10/2003 | Song et al. |
| 2004/0051571 | A1 | 3/2004 | Okamura |
| 2005/0014300 | A1 | 1/2005 | Welch et al. |
| 2005/0046584 | A1 | 3/2005 | Breed |
| 2005/0058234 | A1 | 3/2005 | Stojanovic |
| 2005/0069031 | A1 | 3/2005 | Sunter et al. |
| 2005/0094927 | A1 | 5/2005 | Kish et al. |
| 2005/0097420 | A1 * | 5/2005 | Frisch et al. ............ 714/742 |
| 2005/0286436 | A1 | 12/2005 | Flask |
| 2006/0005093 | A1 | 1/2006 | Leslie |
| 2006/0139387 | A1 | 6/2006 | Silverbrook et al. |
| 2006/0176943 | A1 * | 8/2006 | Sindalovsky et al. ............ 375/225 |
| 2006/0284814 | A1 * | 12/2006 | Ng ............ 345/98 |
| 2008/0013456 | A1 | 1/2008 | Hafed |
| 2008/0048726 | A1 | 2/2008 | Hafed |
| 2008/0192814 | A1 | 8/2008 | Hafed et al. |

FOREIGN PATENT DOCUMENTS

| | | | |
|---|---|---|---|
| JP | 09331254 A | * | 12/1997 |
| JP | 2005006071 A | | 1/2005 |
| WO | WO2005109666 A | | 11/2005 |
| WO | 2007051160 A2 | | 5/2007 |

OTHER PUBLICATIONS

International Search Report and Written Opinion dated Aug. 1, 2008 for related application PCT/US07/73454 filed Jul. 13, 2007 entitled "Signal Integrity Measurement System and Methods Using a Predominantly Digital Time-Base Generator," Hafed.

First Examination Report issued by European Patent Office dated Nov. 16, 2009, in connection with related European Patent Appl. No. 05744211.3, entitled System and Method for Generating a Jittered Test Signal, Hafed, Mohamed M. et al.

Shimanouchi, Masashi, Periodic Jitter Injection with Direct Time Synthesis by SPP ATE for SerDes Jitter Tolerance Test in Production, ITC International Test Conference; Paper 3.1; 0-7803-8106; Aug. 2003; IEEE, pp. 48-57.

Hafed et al., "A High-Throughput 5 GBPS Timing and Jitter Test Module Featuring Localized Processing," International Test Conference 2004, Oct. 26-28, 2004 Charlotte Convention Center, Charlotte, NC, ETATS-UNIS (2004), IEEE Catalog No. 04CH37586, ISBN: 0-7803-8580-2, pp. 728-737.

Hafed, et al., "An 8-Channel, 12-bit, 20 MHz Fully Differential Tester IC for Analog and Mixed-Signal Circuits," Solid-State Circuits Conference, 2003, ESSCIRC 2003, proceedings of the 29th European; Published Sep. 16, 2003, pp. 193-196; ISBN: 0-7803-7995-0.

Hafed et al., "A 5-Channel, Variable Resolution 10-GHz Sampling Rate Coherent Tester/Oscilloscope IC and Associated Test Vehicles," IEEE Mar. 2003, Custom Integrated Circuits Conference, pp. 621-624.

Hafed et al., "A 4-GHz Effective Sample Rate Integrated Test Core for Analog and Mixed-Signal Circuits," IEEE Journal of Solid-State Circuits, Vol, 37, No. 4, Apr. 2002, pp. 499-514.

Hafed et al., "Test and Evaluation of Multiple Embedded Mixed-Signal Test Cores," International Test Conference 2002, paper 35.3, ISBN 0-7803-7542-4, pp. 1022-1030.

Hafed et al., "Sigma-Delta Techniques for Integrated Test and Measurement," IEEE Instrumentation and Measurement Technology Conference, Budapest, Hungary, May 21-23, 2001; 0-7803-6646.

Larsson, Patrick, "A 2-1600-MHz CMOS Clock Recovery PLL with Low-Vdd Capability," In Solid-State Circuits, IEEE Journal, Dec. 1999, vol. 34, Issue 12, pp. 1951-1960.

International Search Report and Written Opinion dated Feb. 12, 2008 for corresponding PCT application PCT/US06/60295 filed Oct. 27, 2006 entitled "High-Speed Transceiver Tester Incorporating Jitter Injection," Hafed et al.

Related application U.S. Appl. No. 12/028,577, filed Feb. 8, 2008 entitled "System and Method for Physical-Layer Testing of High-Speed Serial Links in their Mission Environment," Hafed et al.

International Search Report and Written Opinion dated Jul. 22, 2008 for related application PCT/US08/53476 filed Feb. 8, 2008 entitled "System and Method for Physical-Layer Testing of High-Speed Serial Links in their Mission Environment," Hafed et al.

International Search Report and Written Opinion dated Mar. 11, 2008 for related application PCT/US07/73458 filed Jul. 13, 2007 entitled "High-Speed Signal Testing System Having Oscilloscope Functionability," Hafed.

Related U.S. Appl. No. 12/026,760, filed Feb. 6, 2008 entitled "Systems and Methods for Testing and Diagnosing Delay Faults and for Parametric Testing in Digital Circuits," Hafed.

First Office Action dated Sep. 2, 2009 in connection with related U.S. Appl. No. 11/776,865, filed Jul. 12, 2007, entitled "High-Speed Signal Testing System Having Oscilloscope Functionality," Inventor: Mohamed Hafed.

Office Action dated Dec. 2, 2010, with regard to related U.S. Appl. No. 12/028,577, filed Feb. 8, 2008, Hafed.

Notice of Allowance dated Nov. 18, 2010, with regard to related U.S. Appl. No. 12/026,760, filed Feb. 6, 2008, Hafed.

Office Action dated Jun. 18, 2010, with regard to related U.S. Appl. No. 12/026,760, filed Feb. 6, 2008, Hafed.

Response to Office Action dated Oct. 15, 2010, with regard to related U.S. Appl. No. 12/026,760, filed Feb. 6, 2008, Hafed.
European Extended Search Report dated Oct. 5, 2010, with regard to related European Patent Application No. 06839576.3, filed Oct. 27, 2006, Hafed et al.
Response to Office Action dated Jan. 4, 2010, with regard to related U.S. Appl. No. 11/776,865, filed Jul. 12, 2007, Hafed.
Notice of Allowance dated Jun. 10, 2010, with regard to related U.S. Appl. No. 11/776,865, filed Jul. 12, 2007, Hafed.
Chinese Office Action dated Dec. 1, 2010, with regard to related Chinese Application No. 200780033984.1, filed Jul. 13, 2007, Hafed.
Related U.S. Appl. No. 12/701,282, filed Feb. 5, 2010, entitled 'Signal Integrity Measurement Systems and Methods using a Predominantly Digital Time-Based Generator, Hafed.
Chinese Office Action dated Jul. 30, 2010, with regard to related Chinese Patent Application No. 200680049042.8, filed Oct. 27, 2006, Hafed.

Amendment and Response to First Office Action dated Mar. 2, 2011 in connection with related U.S. Appl. No. 12/028,577, filed Feb. 8, 2008, entitled "System and Method for Physical-Layer of High-Speed Serial Links in their Mission Environments," Hafed, Mohamed M. et al.
Office Action dated May 10, 2011 in connection with related U.S. Appl. No. 12/028,577, filed Feb. 8, 2008, entitled "System and Method for Physical-Layer Testing of High-Speed Serial Links in Their Mission Environments," Mohamed M. Hafed et al.
Extended European Search report dated Mar. 14, 2011 in connection with related European Patent Application No. 07799564.5, entitled "Signal Integrity Measurement Systems and Methods using a Predominantly Digital Time-base Generator," DFT Microsystems, Inc.

* cited by examiner

HIGH-SPEED TRANSCEIVER TESTER INCORPORATING JITTER INJECTION

RELATED APPLICATION DATA

This application claims the benefit of priority of U.S. Provisional Patent Application Ser. No. 60/730,633, filed Oct. 27, 2005, and titled "High-Speed Transceiver Tester Incorporating Jitter Injection," that is incorporated by reference herein in its entirety.

FIELD OF THE INVENTION

The present invention generally relates to the field of integrated circuit testing. In particular, the present invention is directed to a high-speed transceiver tester incorporating jitter injection.

BACKGROUND OF THE INVENTION

High-speed transceiver circuitry is finding widespread use in the microelectronics and computer industries because of its superior traits over conventional bus technologies. These traits include, without limitation, improved throughput and wiring efficiencies. This circuitry, however, is analog in nature and is generally hard to design, characterize, and manufacture reliably. Accordingly, this unreliability creates challenges in the production test-phase. These challenges are forcing test professionals to revise their quality-assurance methodologies. These revisions, for example, include formulating new methodologies to screen modem high-speed transceiver designs because simple loop back testing is no longer sufficient.

Consequently, to properly screen high-speed transceiver designs, stressed-eye tests are required. These tests generate and introduce artificially induced jitter to a transceiver device, with the objective to measure the device's ability to resist the jitter. Notably, jitter-injection instruments for stressed-eye generation currently exist. These instruments, however, are rarely practical for production testing because of the instrument's high cost, limited number of channels, and the need for analog modulation circuitry. Moreover, delay-line techniques, used extensively for jitter injection, are unable to generate delay steps fine enough for the smallest delay element available in current high-speed transceiver designs. This deficiency may be overcome by using analog phase interpolation techniques, which allow for the generation of delay steps that are smaller than a unit delay element. These techniques, however, require careful tuning and are susceptible to process, manufacturing, and environmental conditions, and preclude the introduction of delay generators in digital-only or low-cost applications.

SUMMARY

In one embodiment, the present disclosure is directed to a high-speed digital tester. The high-speed digital tester comprises a jitter generator that includes a multiplexer configured to receive a first clock input signal and a second clock input signal phased-shifted relative to the first clock input signal by a delay. The multiplexer has a multiplexer output and a multiplexer select port. A phase filter is operatively connected to the multiplexer output. A phase selection signal generator is in operative communication with the multiplexer select port and is configured to generate a phase-selecting signal for continually selecting between the first clock signal and the second clock signal.

In another embodiment, the present disclosure is directed to a method of generating a high-speed jittered test pattern. The method comprises generating a rapidly varying phase signal containing a low-frequency phase signal and at least one high-frequency component. The rapidly varying phase signal is filtered so as to create a filtered phase signal substantially lacking the at least one high-frequency component. Parallel data is serialized as a function of the filtered phase signal so as to create a high-speed jittered test pattern.

In yet another embodiment, the present disclosure is directed to a method of testing a device under test having a serial receive port and a serial transmit port. The method comprises generating a rapidly varying phase signal containing a low-frequency phase signal and at least one high-frequency component. The rapidly varying phase signal is filtered so as to create a filtered phase signal substantially lacking the at least one high-frequency component. Parallel data on a plurality of data input ports is serialized as a function of the filtered phase signal so as to create a serial test pattern. The serial test pattern is input into the serial receive port of the device under test. A serial data signal from the serial transmit port of the device under test. The serial data signal is deserialized into parallel data so as to create a deserialized data signal. The deserialized data signal for input into the serial receive port of the device under test.

In a further embodiment, the present disclosure is directed to a method of testing a device under test having a serial receive port and a serial transmit port. The method comprises enabling the device under test to transmit a serial data signal on its serial transmit port. The serial data signal is received from the serial transmit port of the device under test. The serial data signal is deserialized into parallel data. The parallel data is input into a plurality of data input ports of a serializer. A rapidly varying phase signal containing a low-frequency phase signal and at least one high-frequency component is generated. The rapidly varying phase signal is filtered so as to created a filtered phase signal substantially lacking the at least one high-frequency component. Data on the plurality of data input ports is serialized as a function of the filtered phase signal so as to create a serial test signal. The serial test signal is input into the serial receive port of the device under test. The device under test is enabled to compare the received signal against the serial data signal.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

Figure 1:
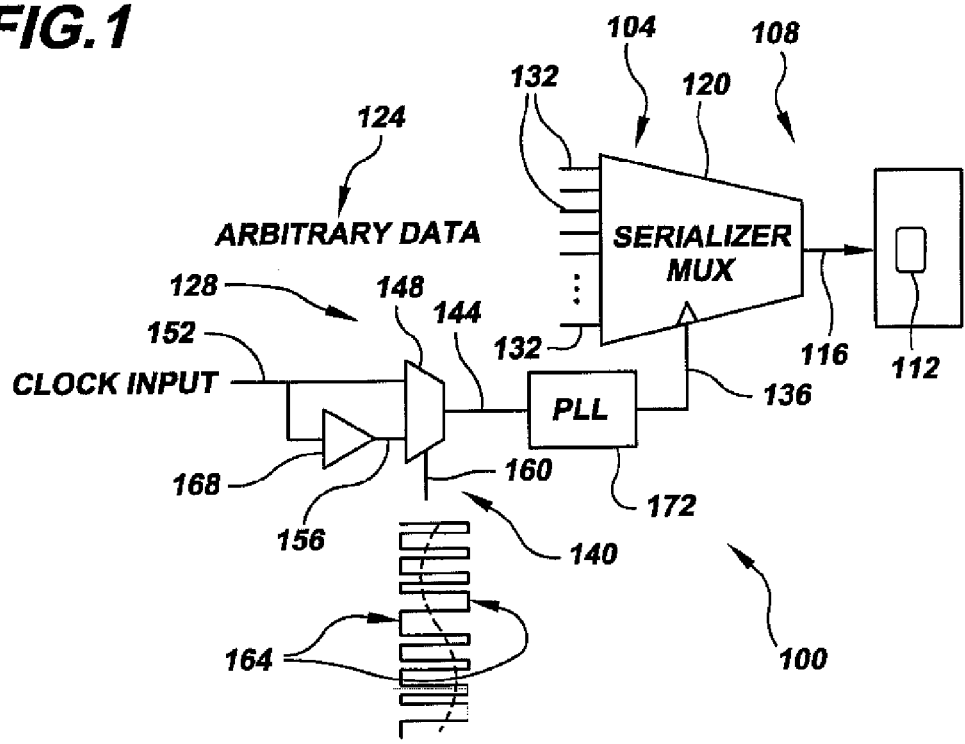
FIG. 1 is a schematic diagram of a test setup of the present disclosure.

Referring now to the drawings, FIG. 1 illustrates a jitter-test setup 100 in accordance with a first embodiment of the present invention. At a high level, test setup 100 includes a high-speed tester 104 in communication with a one or more devices-under-test (DUTs), e.g., DUT 108, each comprising high-speed transceiver circuitry, such as transceiver circuitry 112. As described below in detail, tester 104 is configured for providing transceiver circuitry 112 with a high-speed jittered stimulus pattern (represented by arrow 116) for testing the transceiver circuitry's response to jittered input. As also described below, a useful feature of tester 104 is that the tester can be designed to generate jittered stimulus patterns, such as pattern 116, based on very small delays (generally limited fundamentally only by noise due to thermal agitation in semi-conductor devices) using very simple hardware. As those having ordinary skill in the art will readily appreciate, DUT 108 may be virtually any microelectronic device that includes high-speed transceiver circuitry, such as those used in PCI-Express®, Serial ATA, Serial RapidIO®, Full-buffered DIMM, and Hypertransport® applications, among others, that can benefit from testing using a jittered high-speed serialized data signal.

In the embodiment shown, tester 104 includes at least one high-speed data-transmit serializer 120 for serializing parallel test data 124 and a jitter generator 128 for driving the input of the data-transmit serializer so as to inject jitter into stimulus pattern 116. Test data 124 for stimulus pattern 116 may originate from one or more low-frequency parallel words applied to the inputs 132 of data-serializing multiplexer 120. Test data 124 may be produced from, for example, a memory (not shown) (such as a memory on board tester 104), that will typically, though not necessarily, run at a relatively slow frequency compared to stimulus pattern 116 and typically use the same low-cost technology as DUT 108. During operation, test data 124 enters data-transmit serializer 120 as a function of the output signal 136 of jitter generator 128, thereby converting the parallel test data into high-quality, jittered serial pattern 116 running, for example, at several Gigabits per second (Gbps). Those of ordinary skill in the art will recognize that instead of single data-transmit serializer 120, tester 104 may include multiple data-transmit serializers to create a low cost multi-lane pulse or multi-lane pattern generator. It should also be understood that data-transmit serializer 120 can be designed to include protocol-specific functions, such as 8 b/10 b encoding, PRBS sourcing and checking, as well as others.

Jitter generator 128 may include a phase modulator 140 for generating a phase-modulated signal 144. In the embodiment shown, modulator 140 includes a multiplexer 148, which combines a clock signal 152 with a phase-delayed clock signal 156 as a function of a phase-selecting signal 160 that selects between the undelayed clock signal and the phase-delayed signal as a function of rapidly varying binary data 164 contained on the phase-selecting signal. As discussed below, binary data 164 is designed to contain various frequency components, e.g., low frequency sine wave and high frequency components and may be generated by any suitable source. Those of ordinary skill in the art will recognize that in the context of multiplexer 148, phase-selecting signal 160 contains control data, represented, in this case of two multi-plexed inputs, by a continuous data stream of high ("1") and low ("0") discrete data bits for selecting between the two inputs. In the embodiment shown, phase-delayed clock signal 156 may be simply generated by passing clock signal 152 through a delay 168, which may be designed to have a fixed delay or a programmable delay value that allows for delay values over a particular range. Those skilled in the art will recognize that these delay values may be selected based on the desired testing conditions for the DUTs under consideration.

An important feature of tester 104 is that delay 168 does not need to be small, so a reasonably margined size can be used to allow for more robustness to process variations. With tester 104 shown, achieving the fine delay generation is accomplished in the algorithmic step of the selection of phase-selecting signal 160 and is not dependent on or limited by any particular hardware implementation. There are several advantages to this property of the proposed invention. The clock speed at the input of the PLL, and the speed at which the phase selection logic is clocked, is in the range of 100 MHz to 300 MHz whereas the final output speed is in the range of 2 GHz to 6 GHz. Thus, tester 104 allows the injection of both large and small jitter values on GHz signals using a single hardware circuit: the largest value of jitter is equal to the value of delay 168 (which can be constructed easily at 100 MHz), and the smallest value is determined by the properties of sigma-delta modulation as discussed previously.

Figure 2:
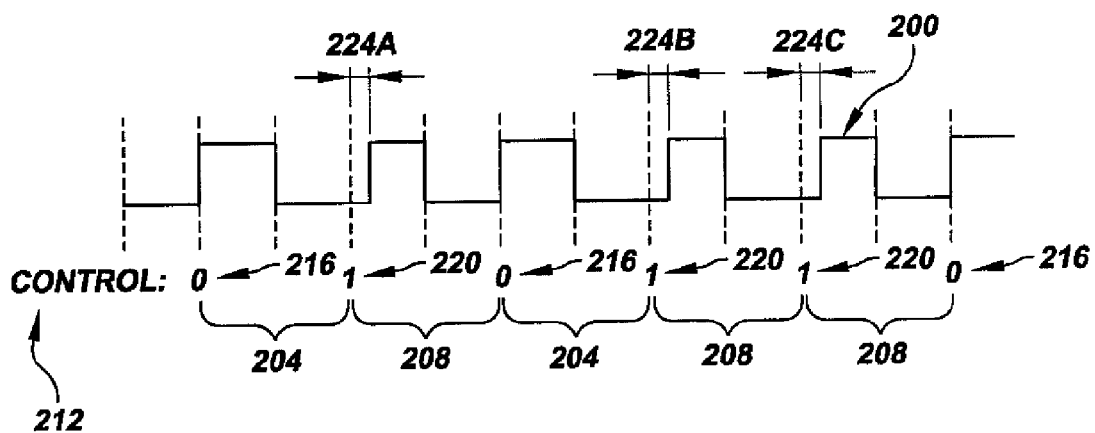
FIG. 2 is a diagram of the phase-modulated signal input into the PLL of FIG. 1.

Referring to FIG. 2, and also to FIG. 1, FIG. 2 illustrates an exemplary portion 200 of phase-modulated signal 144 of FIG. 1 as generated by the operation of multiplexer 148 (FIG. 1) on clock input signal 152, phase-delayed clock signal 156 and phase-selecting signal 160. In FIG. 2, portion 200 is a square wave signal consisting of a plurality of clock signal portions 204 and delayed signal portions 208. Phase-select signal portion 212, depicted as a plurality of low control bits 216 (i.e., "0," which selects clock signal 152) and a plurality of high control bits 220 (i.e., "1," which selects phase-delayed clock signal 156), reflects a portion of phase-selecting signal 160 (FIG. 1) received by the multiplexer, as discussed above. Those skilled in the art will recognize that phase-modulated signal 144 includes a plurality of delay portions 224A-C that are equal in value. These portions 224A-C are consistent with the fixed delay induced by coarse delay 168 previously noted in connection with FIG. 1.

Referring again to FIG. 1, jitter generator 128 further includes a phase filter, such as phase-locked loop (PLL) 172, adapted for the fine-delay-generation technique employed by tester 104. More particularly, in order to inject jitter digitally and stress high-speed transceiver circuitry 112 to measure its tolerance to transmission disturbances, tester 104 relies on a fine-delay-generation technique that exploits the frequency-selective nature of PLL 172. During operation, PLL 172 receives and filters high-frequency components from phase-modulated signal 144 so as to generate output signal 136, which, as discussed above, is the input to the select line of data-transmit serializer 120. Consequently, test data 124 enters data-serializer multiplexer 120 as a function of output signal 136, which is a high-frequency filtered version of phase-modulated signal 144, thereby converting the parallel test data into high-quality, jittered serial pattern 116. Those having ordinary skill in the art will recognize that a single PLL 172 may be coupled to a single data-transmit serializer 120, as illustrated, or a single PLL 172 may be coupled to multiple data-transmit serializer 120 (not shown). The former arrangement enables each data-transmit serializer 120 to function independently of the others, whereas the latter arrangement, despite saving power, causes each data-transmit serializer 120 to be jittered in the same manner.

Figure 3:
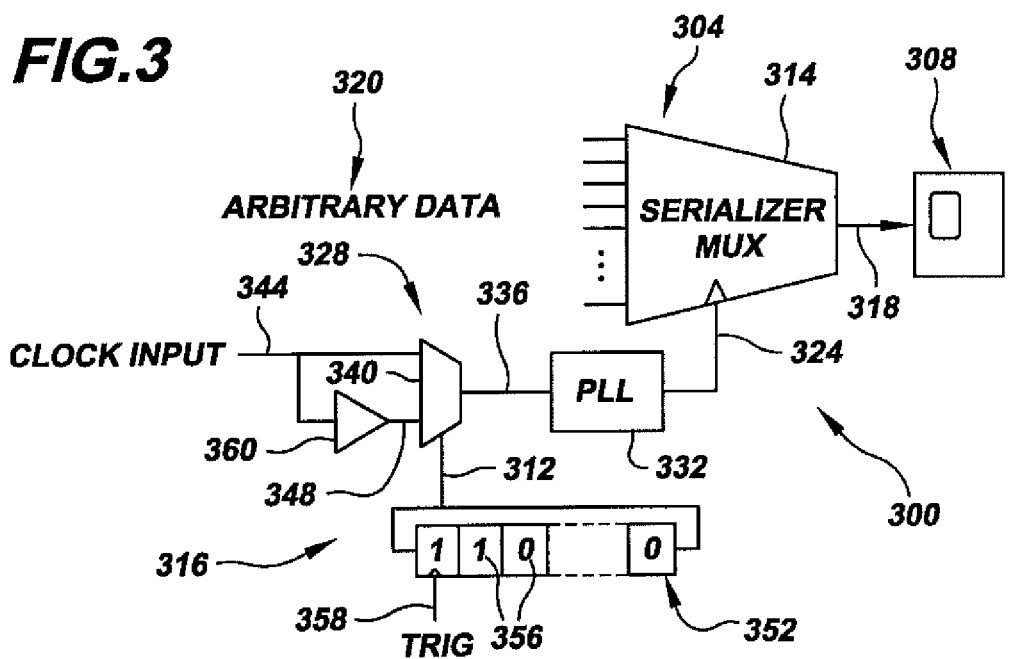
FIG. 3 is a schematic diagram of an alternative high-speed tester of the present disclosure that includes a circular memory for driving the select line of the clock signal multiplexer.

FIG. 3 illustrates another jitter-test setup 300 in accordance with the present disclosure. At a high level, jitter-test setup 300 includes a high-speed tester 304 in operative communication with at least one DUT 308. A difference between jitter-test setup 300 and jitter-test setup 100 of FIG. 1, is that high-speed tester 304 of FIG. 3 has a phase-selecting signal 312 generated by a software-simulated sigma-delta modulator 316. For the sake of illustration, all other components of high-speed tester 304 of FIG. 3 may be the same as or similar to the corresponding respective components of high-speed tester 104 of FIG. 1. That is, high-speed tester of FIG. 3 may include a data-transmit serializer 314 used to generate a high-speed stimulus pattern 318 from arbitrary test data 320 in response to a phase-filtered output signal 324 from a jitter generator 328 that includes a PLL 332 in series with a phase-modulated signal 336 output from a clock signal multiplexer 340 having as its inputs a clock signal 344, a phase-delayed clock signal 348, and phase-selecting signal 312. The operation of high-speed tester 304 may be the same as described above relative to high-speed tester 104 of FIG. 1, except for any difference in operation that simulated sigma-delta modulator 316 may cause.

Figure 4:
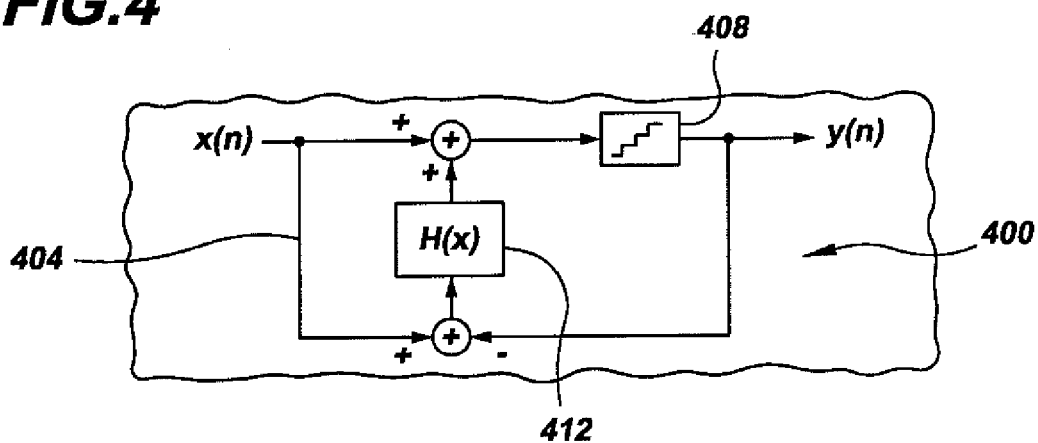
FIG. 4 is a high-level schematic diagram of a sigma-delta modulator suitable for use in a high-speed tester of the present disclosure.

In the embodiment shown, simulated sigma-delta modulator 316 comprises a circular memory 352 that stores a sequence of individual control bits 356 for selecting between the two inputs, i.e., clock signal 344 and phase-delayed clock signal 348, of multiplexer 340 sequentially at a high speed (e.g., 100 MHz-200 MHz) so as to generate phase-modulated signal 336 in the manner described above relative to FIGS. 1 and 2. In the present embodiment contents of circular memory 352 (e.g. control bits 356) are chosen according to sigma-delta modulation. More particularly, a sigma-delta modulator, such as the sigma-delta modulator 400 represented in FIG. 4, is simulated in software for the purpose of generating phase-selecting signal 312. The input x[n] to this sigma-delta modulator 400 is the desired phase modulation signal that is targeted. It could be a DC signal (e.g., delay smaller than the finest delay of current technology), a sine wave signal, or any arbitrarily slow varying signal. The maximum frequency of the input signal x[n] is equivalent to the bandwidth of sigma-delta modulator 400. Generally, sigma-delta modulator 400 includes a feedback loop 404 that loops the output of a multi-bit quantizer 408 to an error modulator 412. Those skilled in the art may refer to S. R. Norsworthy, R. Schreier, G. C. Temes, editors, *Delta-Sigma Data Converters: Theory, Design and Simulations*, New York; IEEE Press, 1997, which is herein incorporated by reference in its entirety, for additional information about sigma-delta conversion.

When sigma-delta modulator 400 is simulated in software, it generates a 1-bit output waveform that contains the original input signal x[n], as well as unwanted high-frequency quantization noise. By matching the bandwidth of sigma-delta modulator 400 to the bandwidth of PLL 332, the unwanted high-frequency quantization noise is guaranteed to be located in the stop-band of the PLL and, therefore, is not propagated through the PLL into phase-filtered output signal 324. For example, since most PLLs have a second-order phase response, only a second-order sigma-delta modulator needs to be simulated in software. If a higher-order PLL is used, a matching order sigma-delta modulator may be simulated. A description of the use of a periodic memory, such as circular memory 352, to emulate sigma-delta modulated signals appears in U.S. patent application Ser. No. 09/844,675, which is incorporated by reference herein. It is noted that a full-fledged sigma-delta modulator, such as sigma-delta modulator 400 of FIG. 4, could be used in place of circular memory 352 if the hardware penalty can be tolerated. It is also noted that a non-circular memory could be used in place of circular memory 352. In this case, the repeating sequence of control bits, e.g., the sequence of bits 356 shown in FIG. 3, could be stored in a serial (or other) memory (not shown) many times over in series with one another.

The frequency of clock signal 344 and the clock frequency for the trigger 358 of circular memory 352 can be made equal or they can be different from one another. In the case when they are equal, the minimum frequency will be determined by the bandwidth of the phase response of PLL 332 and the quality of the sigma-delta modulator used. If the clock frequency is too slow, the over-sampling ratio of the sigma-delta modulator will be low, and the quality of the phase signal (e.g. sine wave) will be affected. Conversely, if the clock frequency is high, the quality of the encoded signal is improved, but the maximum size of delay 360 in FIG. 3 is decreased. Consequently, there is a tradeoff between delay modulation range and delay modulation quality with this approach. (FIG. 7, discussed in detail below, illustrates an embodiment of an alternative tester 700 made in accordance with the present invention that alleviates this condition.) In alternative embodiments, the frequencies of clock signal 344 and trigger 358 of circular memory 352 can be different from one another. However, they need to be synchronized.

Figure 5:
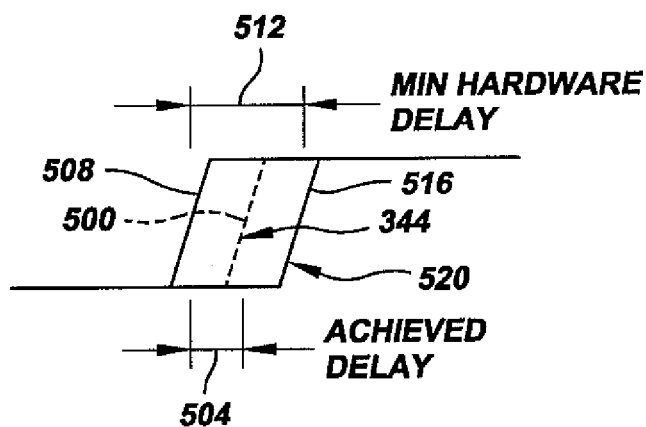
FIG. 5 is a diagram illustrating the delay achievable using a tester of the present disclosure that is smaller than the minimum hardware delay.

Referring to FIG. 5, and also to FIG. 3, FIG. 5 provides a simplified illustration of an important benefit of using a tester made in accordance with the present disclosure, such as tester 304 of FIG. 3. FIG. 5 depicts an exemplary leading edge 500 of a phase-filtered signal, such as phase-filtered signal 324 of FIG. 3. In this example, control bits 356 (FIG. 3) of circular memory 352 encode a DC signal using sigma-delta modulation. That is, the sigma-delta modulator is simulated in software using a constant input signal. Since sigma-delta modulators may exhibit tonal behavior when stimulated by a constant input signal, care must be taken in the simulation phase to ensure that all output harmonics would be sufficiently suppressed by the frequency response of PLL 332. As seen, leading edge 500 (and trailing edge (not shown)) of phase-filtered signal 324 exhibits a delay 504 relative to the corresponding undelayed leading edge 508 that is a fraction of the minimum hardware delay 512 from undelayed leading edge 508 to the leading edge 516 of a hardware-delayed signal 520 delayed with the smallest hardware delay feasible using current technology. Clearly, the simulated sigma-delta modulation allows for an achieved delay (delay 504) that is significantly shorter than the minimum hardware delay 512.

Figure 6:
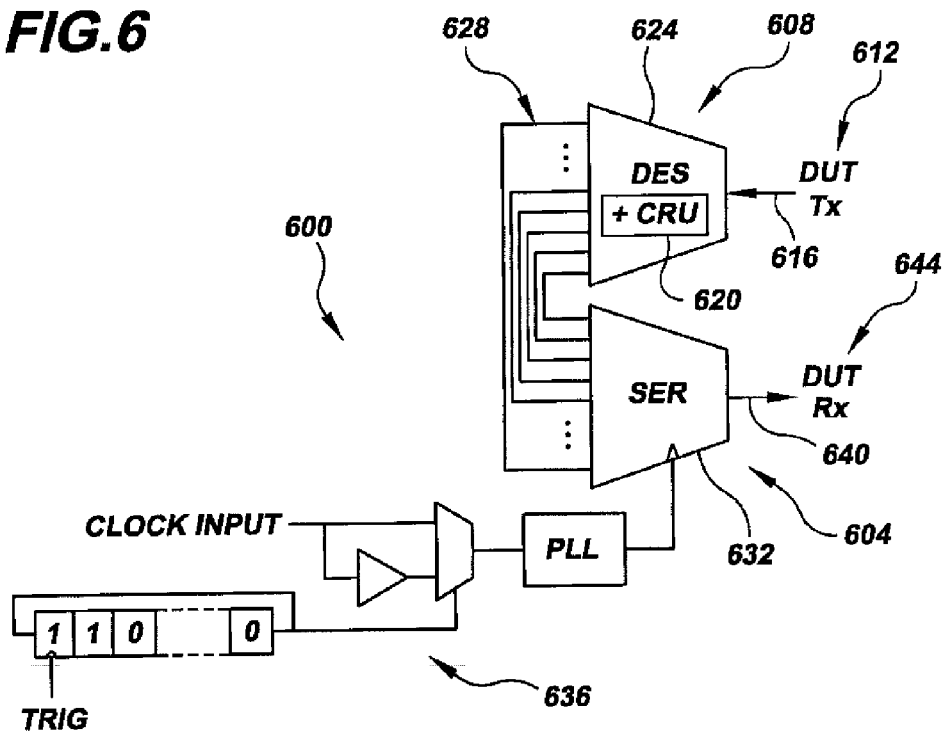
FIG. 6 is a schematic diagram of another high-speed transceiver tester of the present disclosure that includes receive and transmit ports for interfacing with a device-under-test.

Referring next to FIG. 6, this figure shows another high-speed jitter tester 600 made in accordance with the present disclosure. Whereas testers 104, 304 described above relative to FIGS. 1 and 3, respectively, are each shown as including only a transmit port, tester 600 of FIG. 6 has both a transmit port 604 and a receive port 608 that allow for loop-back testing of high-speed transceivers (not shown). More particularly, a high-speed serial transmit port 612 of a DUT (not shown) sends a serial data stream (represented by arrow 616) to receive port 608 of tester 600. In the embodiment shown, receive port 608 includes a clock recovery unit (CRU) 620 for recovering the timing of serial data stream 616 and a deserializer 624 for deserializing serial data stream 616 to a low-frequency parallel bus 628. This parallel bus 628 loops around to a data-transmit serializer 632 at transmit port 604. Looping back the signal on parallel bus 628 is less prone to errors than looping back high-speed serial data stream 616.

Figure 7:
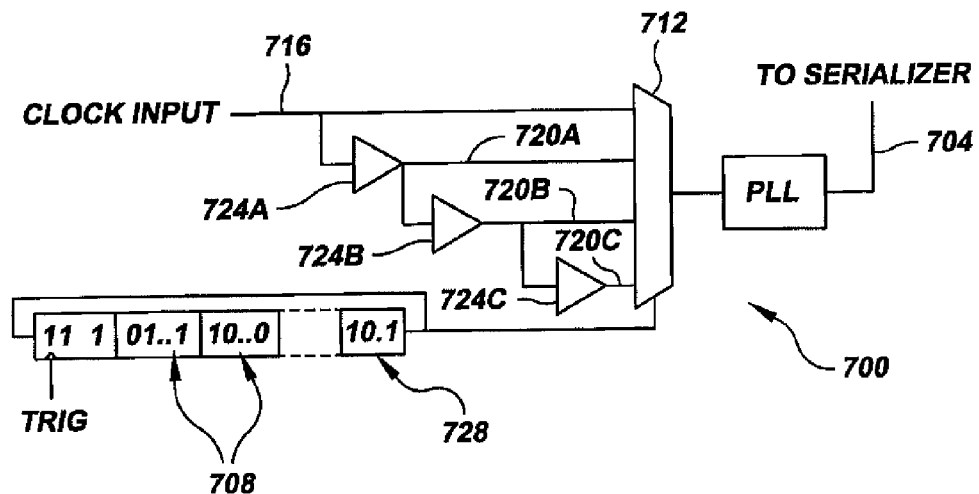
FIG. 7 is a schematic diagram of jitter generator of the present disclosure that utilizes multi-bit modulation.

On its transmit port side, data-transmit serializer 632 of tester 600 is driven by a jitter generator 636 that may be identical, or similar, to any of the jitter generators 128, 328, 700 of FIGS. 1, 3 and 7, respectively. Like data-transmit serializers 120, 314 of FIGS. 1 and 3, respectively, data-transmit serializer 632 outputs a high-speed jittered stimulus pattern (represented by arrow 640) for input into the DUT. Jitter injection may be applied to data-transmit serializer 632 in the same manner as in testers 104, 304 of FIGS. 1 and 3, respectively.

It should be evident to those skilled in the art that the loop-back of tester 600 is different from conventional loop-back. By recovering the clock timing from DUT transmit port 612 and completely deserializing high-speed serial data stream 616, tester 600 completely decouples the DUT transmit performance from the DUT receive performance. What DUT receive port 644 sees is a nominally good signal with controlled jitter profiles. Thus, failures at this phase of the test will be due solely to DUT receive port 644 and not DUT transmit port 612. The clock timing recovery also allows tester 600 to run asynchronously with the DUT (in addition to running synchronously, of course). Depending on the application, the ability to test both modes of operation (i.e. synchronous and asynchronous) is often required.

FIG. 7 illustrates a multi-bit jitter generator 700 made in accordance with the present disclosure that generates a phase-filtered jittered signal 704 using multi-bit control data 708, rather than the single-bit control data of jitter generators 128, 328, 636 of FIGS. 1, 3 and 6, respectively. As those of ordinary skill in the art will readily appreciate, multi-bit jitter generator 700 may be used in any one of testers 104, 304, 600 in lieu of the corresponding respective single-bit jitter generators 128, 328, 636.

Driving the multi-bit character of jitter generator 700 is a multiplexer 712 having more than two (binary) inputs. Therefore, more than a single bit is needed for an individual selection to be made from among the inputs. In the embodiment shown, multiplexer 712 is shown as having four inputs, i.e., a clock signal 716 and three delayed clock signals 720A-C. Thus, each selection requires two bits of control data 708. In alternative embodiments, the number of inputs to multiplexer 712 may be more or fewer than four, with control data 708 containing the appropriate number of control bits for each selection.

Delayed-clock signals 720A-C may be generated in any suitable manner. For example, in the embodiment shown, delayed-clock signals 720A-C are created using a cascade of delays 724A-C that may each be similar to delay 168 of FIG. 1. The values of delays 724A-C may all be the same as one another or each may be different from at least one other. In alternative embodiments, delays 724A-C need not be cascaded, but rather may be arranged in parallel with one another. In addition, it is noted that while control data 708 is shown as residing in a circular memory 728, this need not be so. For example, any one of the alternatives discussed above may be used to deliver control data 708 to multiplexer 712. Control data 708 may be generated using the same methods as used in the single-bit cases described above. Regarding a simulated sigma-delta modulator embodiment for a multi-bit jitter generator, the primary difference is that a multi-bit sigma-delta modulator, rather than a single-bit sigma-delta modulator, is simulated in software.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A high-speed digital tester, comprising:
a jitter generator that includes:
a multiplexer configured to receive a first clock input signal and a second clock input signal phased-shifted relative to said first clock input signal by a delay, said multiplexer having a multiplexer output and a multiplexer select port;
a phase filter operatively connected to said multiplexer output; and
a phase selection signal generator in operative communication with said multiplexer select port and configured to generate a phase-selecting signal for continually selecting between said first clock signal and said second clock signal so as to generate a modulated signal containing a high-frequency component;
wherein said phase filter is designed and configured to remove said high-frequency component of said modulated signal.

2. The high-speed digital tester according to claim 1, wherein said delay is constant during each of a plurality of high-speed tests.

3. The high-speed digital tester according to claim 2, wherein said delay is programmable so as to allow said delay to be varied among said plurality of tests.

4. The high-speed digital tester according to claim 1, wherein said modulated signal has a low-frequency component and the high-frequency component and said phase filter has a pass band selected to pass said low-frequency component and stop said high-frequency component.

5. The high-speed digital tester according to claim 1, wherein said phase filter comprises a phase-locked loop (PLL).

6. The high-speed digital tester according to claim 1, wherein said phase filter has a filter output and the digital tester further comprises a parallel-data serializer having a serializer select port in operative communication with said filter output.

7. The high-speed digital tester according to claim 6, wherein said data serializer includes a plurality of data input ports and the tester further comprises a deserializer having a plurality of data output ports in communication with corresponding respective ones of said plurality of data input ports of said serializer.

8. The high-speed digital tester according to claim 7, wherein said deserializer is configured to receive a serial data stream having a clock timing and the tester further comprises a clock recovery unit for recovering the clock timing from the serial data stream.

9. The high-speed digital tester according to claim 1, wherein said phase selection signal generator comprises a circular memory.

10. The high-speed digital tester according to claim 9, wherein said circular memory contains multiplexer control data generated by a simulated sigma-delta modulator.

11. The high-speed digital tester according to claim 1, wherein said phase selection signal generator comprises a sigma-delta modulator.

12. The high-speed digital tester according to claim 1, further comprising a coarse delay configured to delay said first clock input signal by said delay so as to create said second clock input signal.

13. The high-speed digital tester according to claim 1, wherein said multiplexer receives at least three differently phased clock input signals.

14. The high-speed digital tester according to claim 13, wherein said phase selection signal generator comprises a multi-bit-width circular memory.

15. The high-speed digital tester according to claim 13, wherein said multiplexer is configured to receive a number N of differently phased clock input signals and the digital tester further comprises N−1 coarse delay elements having differing delays for creating a sequence of said N differently phased clock input signals.

16. A method of generating a high-speed jittered test pattern, comprising:
generating a rapidly varying phase signal containing a low-frequency phase signal and at least one high-frequency component by continually selecting between two or more differently phased clock signals;
filtering said rapidly varying phase signal so as to create a filtered phase signal substantially lacking said at least one high-frequency component; and
serializing parallel data as a function of said filtered phase signal so as to create a high-speed jittered test pattern.

17. The method according to claim 16, wherein the step of alternatingly selecting from among said plurality of differently phased clock signals is performed using a phase selection signal.

18. The method according to claim 17, further comprising a step of generating said phase selection signal.

19. The method according to claim 18, wherein the step of generating said phase selection signal includes triggering a circular memory.

20. The method according to claim 19, wherein the step of generating said phase selection signal includes triggering a multi-bit-width circular memory.

21. The method according to claim 16, wherein the step of generating said rapidly varying phase signal includes selecting between a clock signal and a delayed clock signal in accordance with periodic sigma-delta modulation.

22. The method according to claim 16, wherein the step of filtering said rapidly varying phase signal comprises inputting said rapidly varying phase signal into a phase-locked loop.

23. A method of testing a device under test having a serial receive port and a serial transmit port, comprising:
generating a rapidly varying phase signal containing a low-frequency phase signal and at least one high-frequency component by continually selecting between two or more differently phased clock signals;
filtering said rapidly varying phase signal so as to create a filtered phase signal substantially lacking said at least one high-frequency component;
serializing parallel data on a plurality of data input ports as a function of said filtered phase signal so as to create a serial test pattern;
inputting said serial test pattern into the serial receive port of the device under test;
receiving a serial data signal from the serial transmit port of the device under test;
deserializing said serial data signal into parallel data so as to create a deserialized data signal; and
reserializing said deserialized data signal for input into the serial receive port of the device under test.

24. The method according to claim 23, wherein the step of filtering said rapidly varying phase signal comprises inputting said rapidly varying phase signal into a phase-locked loop.

25. The method according to claim 23, wherein said serial data signal includes clock timing and the method further comprises the step of recovering said clock timing from said serial data signal.

26. A method of testing a device under test having a serial receive port and a serial transmit port, comprising:
enabling the device under test to transmit a serial data signal on its serial transmit port;
receiving said serial data signal from the serial transmit port of the device under test;
deserializing said serial data signal into parallel data;
inputting said parallel data into a plurality of data input ports of a serializer;
generating a rapidly varying phase signal containing a low-frequency phase signal and at least one high-frequency component by continually selecting between two or more differently phased clock signals;
filtering said rapidly varying phase signal so as to create a filtered phase signal substantially lacking said at least one high-frequency component;
serializing data on said plurality of data input ports as a function of said filtered phase signal so as to create a serial test signal;
inputting said serial test signal into the serial receive port of the device under test; and
enabling the device under test to compare the received signal against said serial data signal.

\* \* \* \* \*